United States Patent
Ostermann et al.

(10) Patent No.: US 11,448,713 B1
(45) Date of Patent: Sep. 20, 2022

(54) ANGLE SENSOR

(71) Applicant: Allegro MicroSystems, LLC, Manchester, NH (US)

(72) Inventors: Till-Jonas Ostermann, Hirschberg (DE); Simon E. Rock, Heidelberg (DE); Emil Pavlov, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/374,219

(22) Filed: Jul. 13, 2021

(51) Int. Cl.
- *G01R 33/07* (2006.01)
- *G01B 7/30* (2006.01)
- *G01R 33/09* (2006.01)
- *G01R 33/00* (2006.01)

(52) U.S. Cl.
CPC .............. *G01R 33/07* (2013.01); *G01B 7/30* (2013.01); *G01R 33/0094* (2013.01); *G01R 33/09* (2013.01)

(58) Field of Classification Search
CPC .... G01R 33/07; G01R 33/0094; G01R 33/09; G01B 7/30
See application file for complete search history.

(56) References Cited

U.S. PATENT DOCUMENTS

| | | | | |
|---|---|---|---|---|
| 8,324,891 B2 * | 12/2012 | Kejik | ..................... | G01R 33/07 324/207.13 |
| 10,852,161 B2 | 12/2020 | Cesaretti et al. | | |
| 10,866,117 B2 | 12/2020 | Kozomora et al. | | |
| 2018/0231399 A1 * | 8/2018 | Okumura | .............. | G01D 5/2454 |
| 2018/0364066 A1 * | 12/2018 | Satz | ........................ | G01D 5/147 |
| 2019/0317120 A1 * | 10/2019 | Fontanesi | ............... | G01P 3/488 |
| 2020/0088546 A1 | 3/2020 | Sirohiwala et al. | | |
| 2021/0011097 A1 | 1/2021 | David et al. | | |
| 2021/0018309 A1 * | 1/2021 | Ausserlechner | ....... | G01D 5/145 |

OTHER PUBLICATIONS

Texas Instruments, "TMAG5170-Q1 3-Axis Linear Hall Effect Sensor with SPI Interface", vol. SBAS934, Jun. 2020; 45 Pages, www.ti.com.
U.S. Appl. No. 17/015,132, filed Sep. 9, 2020, Romero.
Texas Instruments, "TMAG5170-Q1 3-Axis Linear Hall Effect Sensor With SPI Interface;" SBAS934; Jun. 2020; 45 Pages.

* cited by examiner

*Primary Examiner* — Alvaro E Fortich
(74) *Attorney, Agent, or Firm* — Daly Crowley Mofford & Durkee, LLP

(57) ABSTRACT

Methods and apparatus for a magnetic field sensor having first and second arrays of magnetic field sensing elements with at least first and second orthogonal axes of sensitivity. The first array of magnetic field sensing elements is spaced a first distance from the second array of magnetic field sensing elements. A turns counter counts a number of times a magnetic pole pair of a moving target passes the magnetic field sensing elements with a selected pole pair resolution and a module determines absolute angular position of the target from differential signals from the first and second arrays of magnetic field sensing elements and the turns counter. The first distance is configured to match a pitch of the poles of the target.

26 Claims, 7 Drawing Sheets

| Number | Name | Function |
|---|---|---|
| 1 | VCC | Supply |
| 2 | MISO | SPI output (Master-In Slave-Out) |
| 3 | NC | No connect |
| 4 | SCLK | SPI clock |
| 5 | OUT/$\overline{CS}$ | Analog, PWM, SENT, Manchester output/chip-select (SPI) |
| 6 | MOSI | SPI input (Master-Out Slave-In) |
| 7 | BYPASS | Bypass pin |
| 8 | GND | Ground |

ANGLE SENSOR

BACKGROUND

Magnetic field sensors can be used in a variety of applications. In one application, a magnetic field sensor can be used to detect an angle of rotation of a ferromagnetic object. In another related application, a magnetic field sensor can be used to sense a rotation (e.g., a continuous or discontinuous rotation) of a ferromagnetic object.

Within a magnetic field sensor, planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to a magnetic field parallel to a surface of a substrate on which the vertical Hall element is formed. Also, within a magnetic field sensor, various types of magnetoresistance elements are known. Most types of magnetoresistance elements tend to be responsive to magnetic fields parallel to a surface of a substrate on which the magnetoresistance element is formed.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

SUMMARY

Embodiments of the disclosure provide methods and apparatus for a magnetic field sensor for angle and/or linear motion sensing. The sensor can include magnetic field sensing elements for generating signals that can be processed to determine angular position of a target, such as a rotating shaft, for example. In some embodiments, the magnetic field sensing elements comprise Hall sensing elements for 3D sensing, e.g., one planar and two vertical Hall plates to sense field in the X, Y, and Z dimensions, and analog and/or digital signal processing of the sensing element signals. In some embodiments, a sensor includes two sets of magnetic field sensing elements, such as 3D Hall plates and can operate in a single channel and/or differential mode. The differential mode enables rejection of common stray magnetic fields so that they do not corrupt the measurement of the target magnetic field. In embodiments, a sensor can report an angle calculated on-chip using the magnetic fields measured in any two of the three sensed axes and/or output field strengths measured in all three axes.

In example embodiments, a sensor determines an angle measurement for a target, such as a rotating shaft, using multiple magnetic poles per mechanical rotation. An absolute angle measurement can be obtained using a turns counter, for example. In embodiments, a differential angle sensor is placed in front of a ring magnet with the same pole width (e.g., half pole pair width) as the Hall spacing between 3D hall plate arrays. The turns counter tracks the number of pole pairs passed which identifies the segment in which the target is positioned. In embodiments, an index sensor can be used to determine the absolute angle after one full rotation, for example. Illustrative sensor embodiments can obtain high accuracy side shaft angle measurements while achieving a stray field robust angle measurement.

Example applications for a sensor in accordance illustrative embodiments include automotive and industrial applications, such as throttle and valve position sensing, pedal position sensing, fork and clutch position sensing for transmission, and braking systems.

In one aspect, a magnetic field sensor comprises: a first array of magnetic field sensing elements; a second array of magnetic field sensing elements, wherein the first array of magnetic field sensing elements is spaced a first distance from the second array of magnetic field sensing elements, wherein the first and second arrays of magnetic field sensing elements each have at least first and second axes of sensitivity, wherein the first axis of sensitivity is orthogonal to the second axis of sensitivity; a turns counter to count a number of times a magnetic pole pair of a moving target passes the magnetic field sensing elements with a selected pole pair resolution; and a module to determine absolute angular position of the target from differential signals from the first and second arrays of magnetic field sensing elements and the turns counter, wherein the first distance is configured to match a pitch of the poles of the target.

A sensor can further include one or more of the following features: the turns counter provides quarter pole pair resolution, the turns counter is configured to increment for a north pole boundary, a middle of the north pole, a boundary between the north pole and a south pole, and a middle of the south pole, the first and second arrays of magnetic field sensing elements have a third axis of sensitivity that is orthogonal to the first and second axes of sensitivity, wherein the first, second, and third axes of sensitivity comprises respective x, y, and z axes, the sensor is configured to selected two of the first, second, and third axes of sensitivity, the sensor is configured to sense rotation of the target, wherein the target comprises a shaft, the magnetic field sensing elements comprise Hall elements, a CORDIC module to determine the angular position, the target comprises a ring magnet, the first and second arrays of magnetic field sensing elements each have a third axis of sensitivity that is orthogonal to the first and second axes of sensitivity, the two of the first, second, and third axes of sensitivity can be used to determine the angular position, the sensor is configured to clockwise or counterclockwise rotation of the target, and/or the differential signals from the first and second arrays of magnetic field sensing elements comprise a sine signal and a cosine signal.

In another aspect, a method comprises: employing first and second arrays of magnetic field sensing elements in a sensor, wherein the first array of magnetic field sensing elements is spaced a first distance from the second array of magnetic field sensing elements, wherein the first and second arrays of magnetic field sensing elements each have at least first and second axes of sensitivity, wherein the first axis of sensitivity is orthogonal to the second axis of sensitivity; counting, using a turns counter, a number of times a magnetic pole pair of a moving target passes the magnetic field sensing elements with a selected pole pair resolution; and determining absolute angular position of the target from differential signals from the first and second arrays of magnetic field sensing elements and the turns counter, wherein the first distance is configured to match a pitch of the poles of the target.

A method can further include the turns counter provides quarter pole pair resolution, the turns counter is configured to increment for a north pole boundary, a middle of the north pole, a boundary between the north pole and a south pole, and a middle of the south pole, the first and second arrays of magnetic field sensing elements have a third axis of sensitivity that is orthogonal to the first and second axes of sensitivity, wherein the first, second, and third axes of sensitivity comprises respective x, y, and z axes, the sensor is configured to selected two of the first, second, and third axes of sensitivity, the sensor is configured to sense rotation of the target, wherein the target comprises a shaft, the magnetic field sensing elements comprise Hall elements, a CORDIC module to determine the angular position, the target comprises a ring magnet, the first and second arrays of magnetic field sensing elements each have a third axis of sensitivity that is orthogonal to the first and second axes of sensitivity, the two of the first, second, and third axes of sensitivity can be used to determine the angular position, the sensor is configured to clockwise or counterclockwise rotation of the target, and/or the differential signals from the first and second arrays of magnetic field sensing elements comprise a sine signal and a cosine signal.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
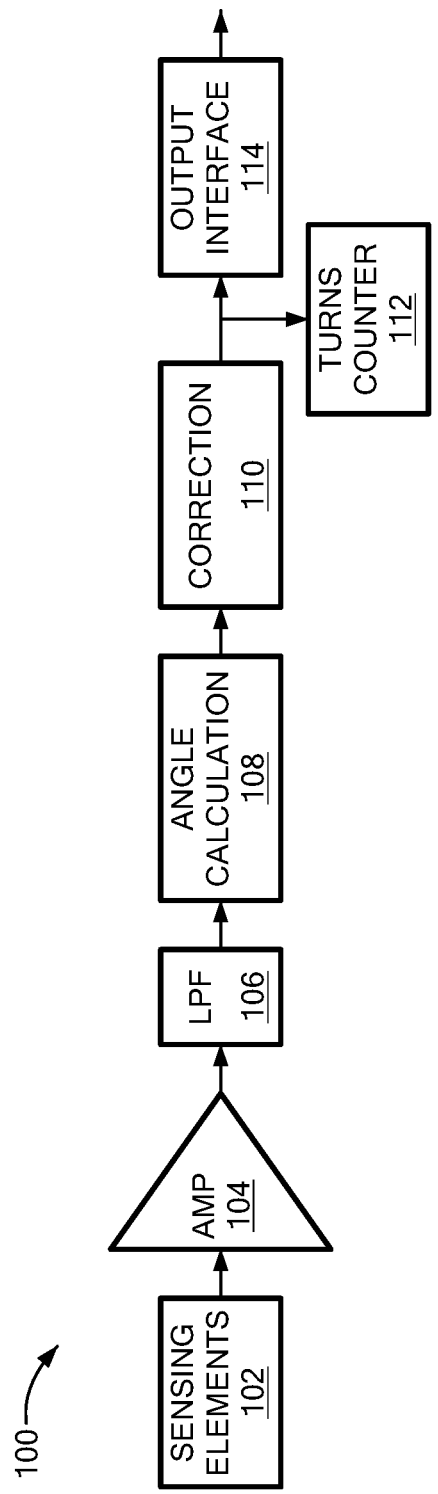
FIG. 1 is a block diagram of an example magnetic field sensor for providing angle and/or linear motion information for a target with a target having the same pole width as the spacing between magnetic field sensing element arrays.

Before describing example embodiments of the disclosure, some information is provided. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, and a vertical Hall element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses one or more magnetic field sensing elements in combination with an electronic circuit, all disposed upon a common substrate, e.g., a semiconductor substrate. Magnetic field sensors are used in a variety of applications, including, but not limited to, angle sensors that sense an angle of a direction of a magnetic field, angle sensors that sense an angle of rotation of a target object, and rotation sensors that sense rotation of a rotating target object (e.g., speed and direction of rotation).

Magnetic field sensors in the form of angle and/or rotation sensors that can sense an angle of rotation of a ferromagnetic object are described herein. As used herein, the term "magnetic field signal" is used to describe any circuit signal that results from a magnetic field experienced by a magnetic field sensing element.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" can be used to describe a "processor." However, the term "module" is used more generally to describe any circuit that can transform an input signal into an output signal that is different than the input signal.

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks (e.g., processors or modules), it will be understood that the analog blocks can be replaced by digital blocks (e.g., processors or modules) that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two-state output signal indicative of an input signal being above or below a threshold level (or indicative of one input signal being above or below another input signal). However, the comparator can also be comprised of a digital circuit (e.g., processor or module) having an output signal or value with at least two states indicative of an input signal or value being above or below a threshold level (or indicative of one input signal or value being above or below another input signal or value), respectively, or a digital signal or value above or below a digital threshold signal or value (or another digital signal or value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "amplifier" is used to describe a circuit element with a gain greater than one, less than one, or equal to one.

As used herein, the terms "line" and "linear" are used to describe either a straight line or a curved line. The line can be described by a function having any order less than infinite.

FIG. 1 shows an example block diagram of a side shaft angle sensor 100 having magnetic field sensing elements that are spaced in relation to pole width of a magnetic target. With this arrangement, a side shaft angle sensor achieve a stray field robust angle measurement with high accuracy. Due to multiple pole detections per mechanical rotation, absolute angle measurement can be detected by using a turns counter, for example. In embodiments, a differential angle sensor is placed in front of a ring magnet with the same pole width (e.g., half pole pair width) as the spacing between 3D Hall plate arrays, for example. A turns counter can be used to track the number of pole pairs passed for identifying the segment in which the target is positioned. In embodiments, a separate index sensor can be used to obtain absolute angle information after one full rotation.

The sensor 100 includes magnetic field sensing elements 102 to detect changes in a magnetic field caused by a moving target, such as rotating shaft. The magnetic field sensing elements 102 can comprise sets of sensing elements positioned to detect field changes in a desired manner, as described more fully below. In example embodiments, the magnetic field sensing elements 102 comprise Hall elements configured so that the difference of the hall signals can be sensed. An amplifier circuit 104 can amplify the differential hall voltage signals from the sensing elements for filtering by a low pass filter 106. Chopping techniques well known in the art may be used to improve signal quality. An angle calculation module 108 can determine an angle from the sensing element differential signals which are stray field immune. A correction module 110 can provide various types of correction to the angle output signal from the angle calculation module 108. A turns counter module 112 can maintain a count of target rotations based on the angular position of the target, as described more fully below. An output interface module 114 can output information in one or more formats to meet the needs of a particular application.

While shown in example embodiments in conjunction with a rotating shaft, illustrative sensors including channels having dedicated polarity, sensitivity, and offset correction that can be used in rotary and linear position applications. A sensor can be used for so-called slide-by applications where the travel exceeds the length that can be sensed by a conventional one-dimensional linear sensor. The angle output from example embodiments of a sensor is directly proportional to linear position. With linearization, stroke lengths greater than the length of the magnet can be realized.

In example embodiments, the output angle value is available in a SPI, SENT, PWM, and/or Analog Output options. Alternatively, the X, Y, and Z differential flux density values may be available to output in SPI and SENT protocols, for example. Along with the magnetic data, the SPI and SENT options can provide access to additional device information, such as temperature error flag information and customer identification register data.

Figure 2:
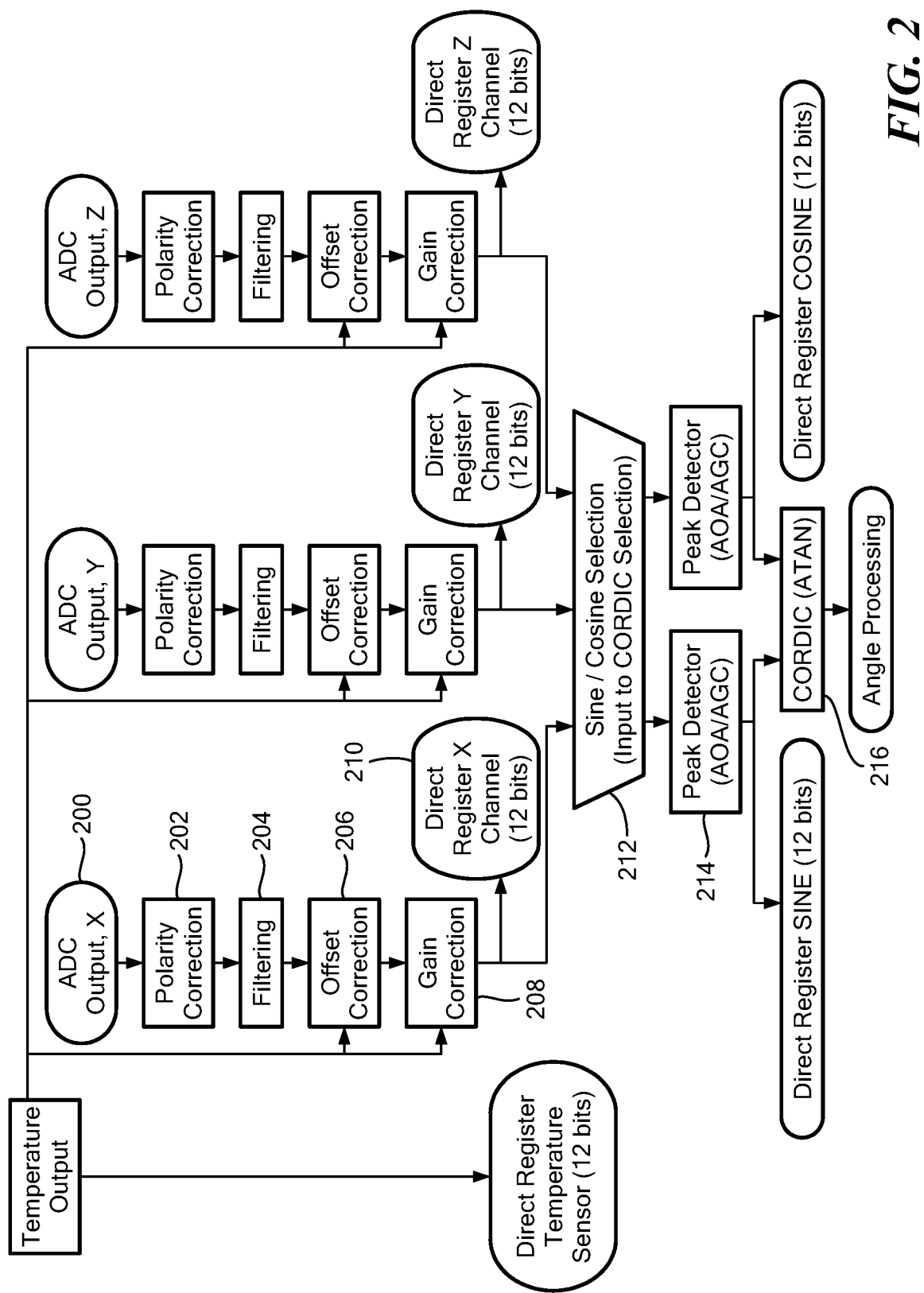
FIG. 2 is a diagram showing example processing performed by the sensor of FIG. 1.
Figure 3:
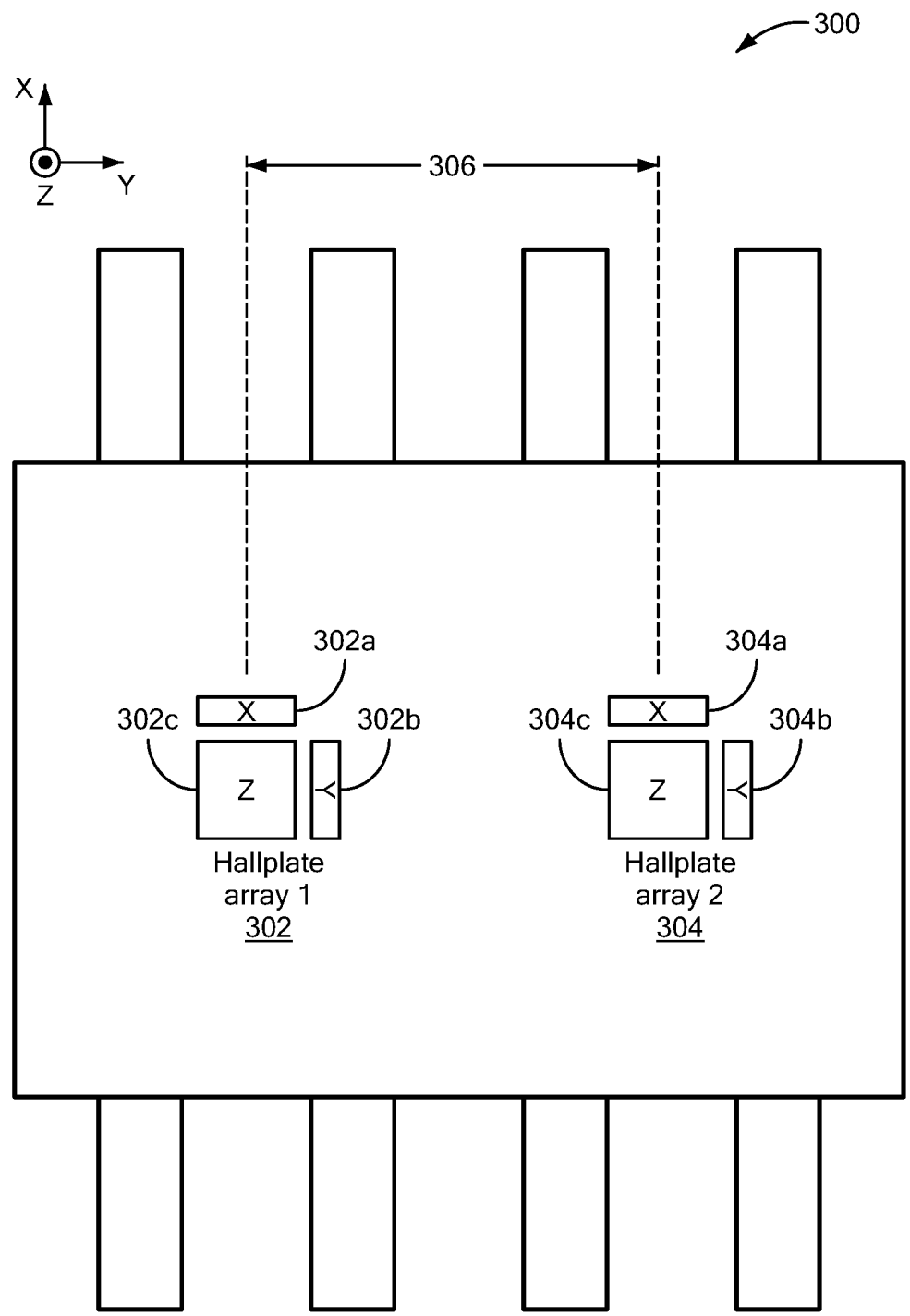
FIG. 3 is a schematic representation of an example sensor having arrays of magnetic field sensing elements.

FIG. 2 shows example processing steps to generate an angle output signal from an angle calculation module, such as the angle calculation module 108 of FIG. 1. It is understood that the example processing of FIG. 2 is for a 3D Hall element configuration capable of sensing magnetic fields in three orthogonal axes, which can be referred to as x, y and x axes. In embodiments, any two axes can be selected for angle calculation using arctangent processing, for example. FIG. 3, which is described below, shows an example 3D Hall element array capable of sensing in three axes.

In step 200, a digitized differential output from the magnetic field sensing elements, hall plate 1-hall plate 2, that sense magnetic fields in the x axis is received. The differential input ensures inherent stray field robustness. In step 202, polarity correction processing can be performed to determine direction of target rotation. In embodiments, a bit can designate the polarity of the angle reading of the device, such as by determining whether there is an increasing output for clockwise or counterclockwise rotation. In step 204, filtering of undesired signals can be performed. In step 206, offset correction can be performed and in step 208 gain correction can be performed. To provide the highest accuracy angle or position output from any orientation, in embodiments, each X, Y, and Z channel has gain and offset correction which allows mismatch between the orthogonal Hall plates to be corrected with high accuracy. This correction capability can be accomplished through a segment processor that allows placement of correction points across the temperature range of the device to provide consistent device performance over temperature. Sensor trim parameters can be adjusted to allow full system level temperature errors to be corrected. In step 210, the corrected signal from the X axis sensing elements can be stored in memory, such as a register.

In embodiments, processing similar to that described above for the x axis sensing elements signal can be performed for the y and z axis sensing elements and is not repeated.

In step 212, a multiplexer module receives signals for the x, y, and z sensing elements. In embodiments, signals for two of the three axes are selected for angle calculation processing. One signal is selected as a sine signal and the other signal is selected as a cosine signal. In step 214, peak detection for the selected signals is performed using Automatic Gain Correction and Automatic Offset Adjustment (AGC/AOA). Automatic gain and offset correction continuously correct for sensitivity and offset drift by using a min/max detector, for example. The min and max of each dimension input to the angle calculation module, e.g., CORDIC processing, and tracked over a selected number of peaks and averaged. From this, the offset and gain can be corrected to match the signal target offset and amplitude, keeping the output angle constant over lifetime and temperature variations. In embodiments, AOA processing automatically corrects offset error through the average of the peak values.

In step 216, angle calculation processing is performed. In embodiments, CORDIC (a tan) processing is performed using the sine and cosine inputs from the selected sensing element signals. In order to calculate the angle output from the 3D sensing elements, a Coordinate Rotation Digital Computer (CORDIC) can be used. To allow for different orientations of the IC package, the sine and cosine inputs to the CORDIC are selectable to be any of the calibrated X, Y, and Z outputs The CORDIC processing uses arctangent to provide the angle between the two input vectors.

With this arrangement, a 3D Hall sensor IC is capable of performing an internal CORDIC calculation of the angular position of a target magnetic field based on any two axes of the three selectable axes (e.g., XY, XZ, or YZ). Each channel has dedicated polarity, sensitivity, and offset correction that allows use in rotary and linear position applications in any mounting orientation relative to the sensing magnet.

FIG. 3 shows an example sensor IC 300 including first and second arrays 302, 304 having magnetic field sensing elements. The first and second arrays 302, 304 are separated by a selected distance 306. The first array 302 can comprise magnetic field sensing elements 302a,b,c each having an axis of sensitivity that is orthogonal to the other. In the illustrated embodiment, the first magnetic field sensing element 302a has an axis of sensitivity on the x axis, the second magnetic field sensing element 302b has an axis of sensitivity on the y axis, and the third magnetic field sensing element 302c has an axis of sensitivity on the z axis.

Similarly, the second array 302 can comprise magnetic field sensing elements 304a,b,c each having an axis of sensitivity are orthogonal to each other. In the illustrated embodiment, the first magnetic field sensing element 304a has an axis of sensitivity on the x axis, the second magnetic field sensing element 304b has an axis of sensitivity on the y axis, and the third magnetic field sensing element 304c has an axis of sensitivity on the z axis.

In example embodiments, a sensor determines an angle measurement for a target, such as a rotating shaft, using multiple magnetic poles per mechanical rotation. An absolute angle measurement can be obtained using a turns counter, for example. In embodiments, a magnetic differential angle sensor is placed in front of a ring magnet with the same pole width (e.g., half pole pair width) as the Hall spacing between 3D hall plate arrays. The turns counter tracks the number of pole pairs passed which identifies the segment in which the target is positioned. In embodiments, an indexing sensor can be used to determine the absolute angle after one full rotation, for example. Illustrative sensor embodiments can obtain high accuracy side shaft angle measurements while achieving a stray field robust angle measurement.

Figure 4:
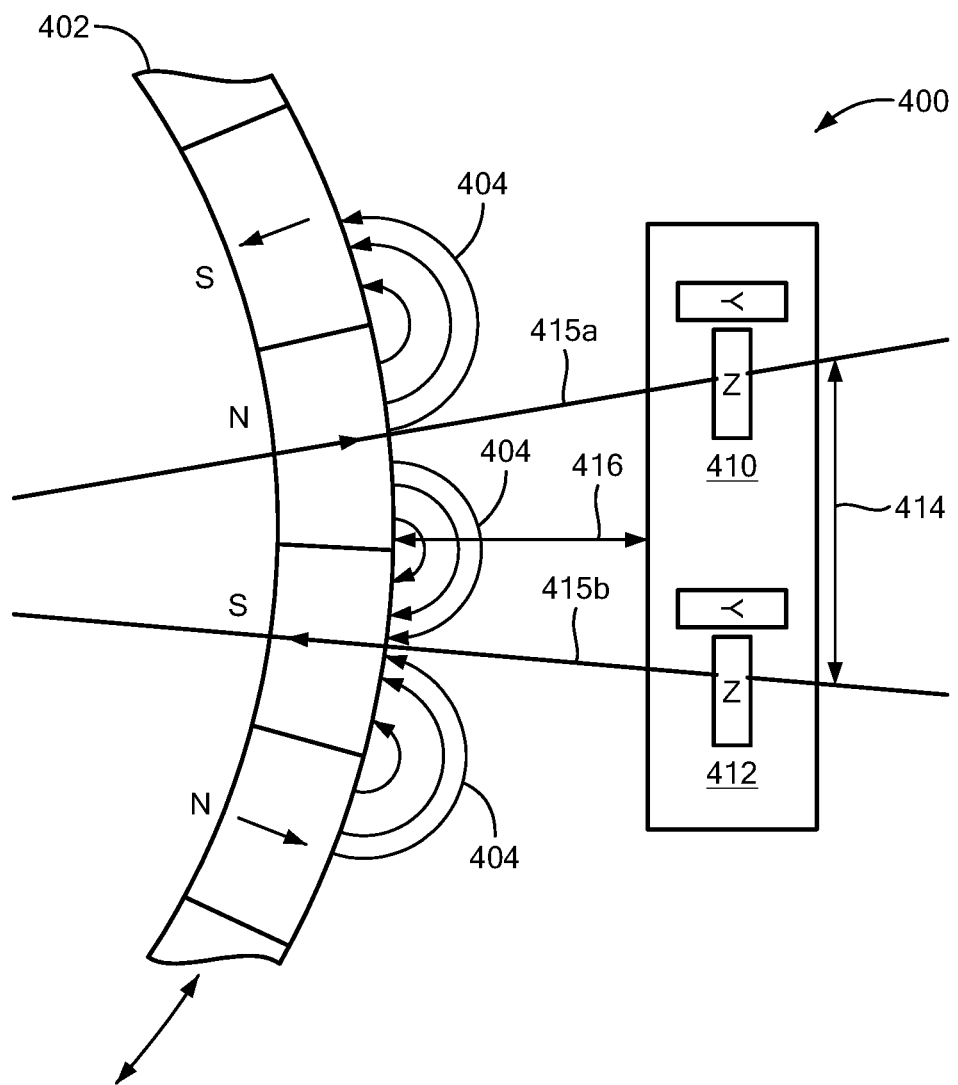
FIG. 4 is a schematic representation of an example sensor having arrays of magnetic field sensing elements with a target positioned in relation to the sensor.

FIG. 4 shows a side view of an example sensor IC 400 spaced from the side of a target 402, such as a rotating shaft, having magnetic poles arbitrarily indicated as N or S. As can be seen, magnetic flux 404 generated by the magnetic target can be detected by the sensor IC 400. As the shaft 402 rotates, changes in the magnetic field can be detected by the sensor IC. The sensor IC 400 includes a first array 410 of magnetic field sensing elements and a second array 412 of magnetic field sensing elements. The first and second arrays 410, 412 are spaced from each other by a distance 414. A first tangent 415a extends from a surface of the arcuate target 402 surface at a middle of a S pole and a second tangent 415b extends from the arcuate target surface at a middle of the adjacent N pole. The tangents 415a,b define an angle determined by the curvature of the target surface.

In the illustrated embodiment, the pitch of the magnetic poles N,S approximately matches the spacing of the first and second magnetic field sensing arrays 410, 412 for a given air gap distance 416. For convenience, sensing elements for the first and second arrays 410,412 are shown for y and z axes of sensitivity. It is understood that the pitch of the magnetic poles, the spacing of the sensing arrays, and the airgap together define whether pitch matches the spacing.

In one embodiment, first and second arrays 410, 412 of sensing elements are spaced at 2.2 mm. The pole pitch of the target surface should effectively also be at a distance of about 2.2 mm. For this configuration, the sensor IC sees the maximum differential signal amplitude since the vector of the magnetic field is reversed at the arrays independent of the target position.

In the illustrated embodiment, the sensor arrays 410,412 are directly over the middle of the neighboring poles. The upper sensor array 410 sees flux going into the target 402, e.g., ring magnet, while the lower sensor array 412 sees flux coming out of the ring magnet. Rotating the target 402 by half a pole clockwise, the upper array 410 sees flux going up while the lower array sees flux going down. No matter the position of the ring magnet 402, the respective flux on the sensor arrays 410, 412 is always going in the opposite direction and therefore the signal is maximal.

Deriving the angle of the differential signal between the sensor arrays 410, 412, e.g., flux of upper plate minus flux of lower plate, allows determination of the exact angle between the poles. Due to the differential nature of the sensor stray field immunity is achieved.

$$\alpha_{diff} = \arctan\left(\frac{B_{Z,HPA2} - B_{Z,HPA1}}{B_{Y,HPA2} - B_{Y,HPA1}}\right) = \arctan\left(\frac{dB_Z}{dB_Y}\right)$$

Figure 5:
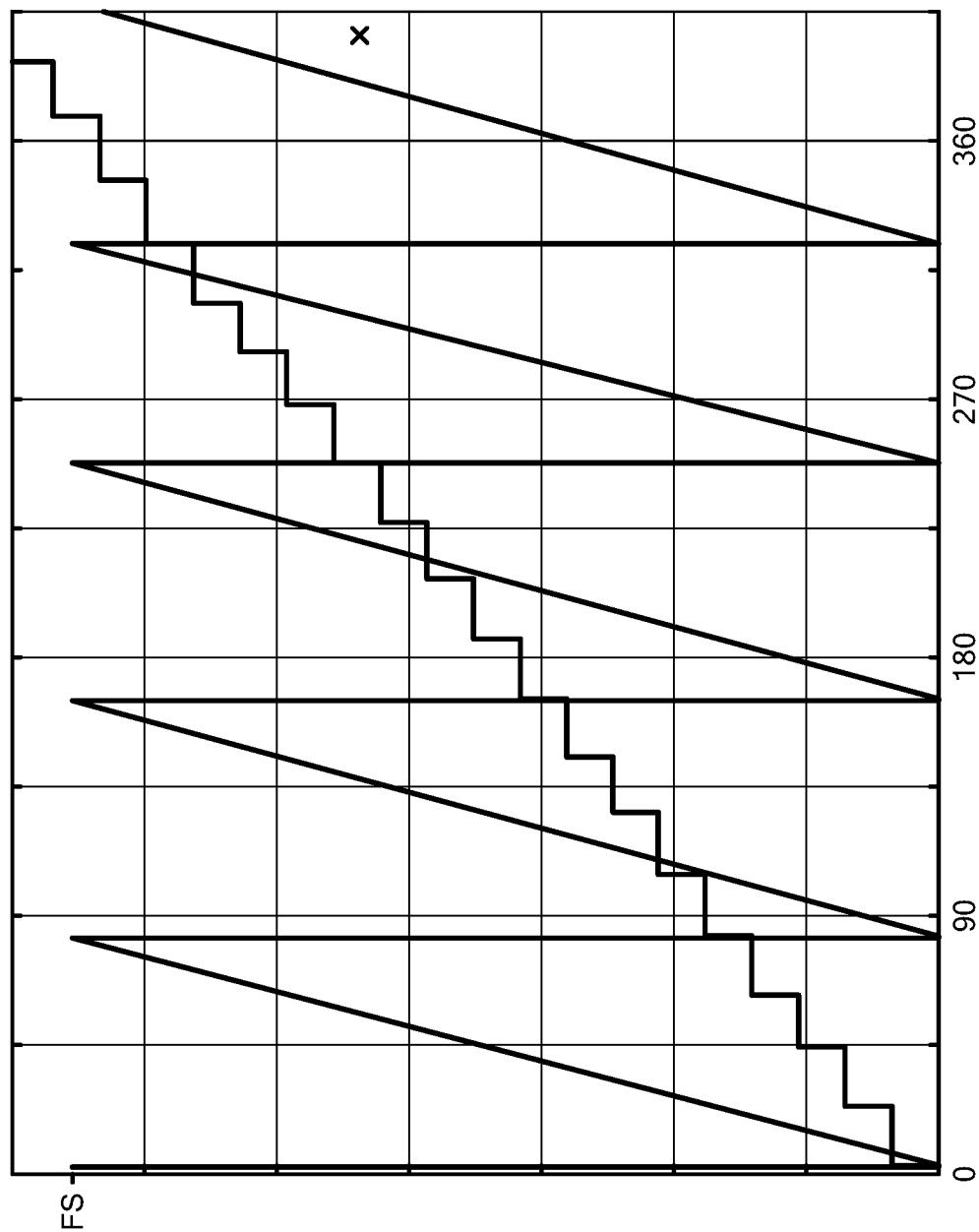
FIG. 5 is a waveform diagram showing sensing element signals and values for an example turns counter.
Figures 6, 7:
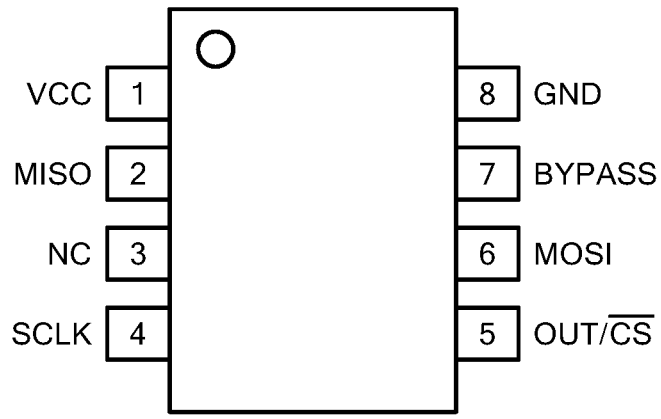
FIG. 6 shows an example pinout diagram for a sensor in accordance with example embodiments of the disclosure.
FIG. 7 shows a tabular listing of a description of the external signals shown in FIG. 6.

FIG. 5 shows a differential angle waveform diagram for device angle over a 360 degree rotation of a target having four pole pairs. In one particular embodiment, the output ranges from zero to full scale FS (differential magnetic 360°) for one pole pair segment of 90 degrees. In the particular embodiment, the turns counter is incremented every quarter of pole pair movement, so that there are 4 steps for a 90° mechanical movement. Over the full mechanical 360° movement, the turns counter in this example increments 16 times. This is the equivalent of a turns count step of 22.5°.

In embodiments, a turns counter, such as the turns counter 112 of FIG. 1, increases or decreases the turns count by one for every 25% of the full-scale output (% FSO) rotation of the target magnet. The turns count value increments for every positive angle rotation where a positive angle is determined by the polarity of the CORDIC angle (see step 202 of FIG. 2). The turn value is accumulated in memory, such as a signed 12-bit register spanning values +2047 to −2048 which equates to +511 to −512 complete 360° rotations wherein the angle gain equals one.

The turns counter allows for the tracking of the passed pole pairs. When used together with an indexing sensor, an absolute angle position angle can be obtained after at most one full rotation, once the index has been given to a host control unit (MCU), for example. For example, a small magnet can be placed next to the target magnet, which can be sensed by a hall switch sensor. This will allow a host controller to detect the absolute 360° position of the rotating target magnet.

The resolution of the turns counter in FIG. 5 per pole pair is 90° magnetical movement of the sensor used in the particular example. The mechanical turns counter resolution can be increased by adding pole pairs. The airgap has no influence on the mechanical turn counter resolution.

Figure 8:
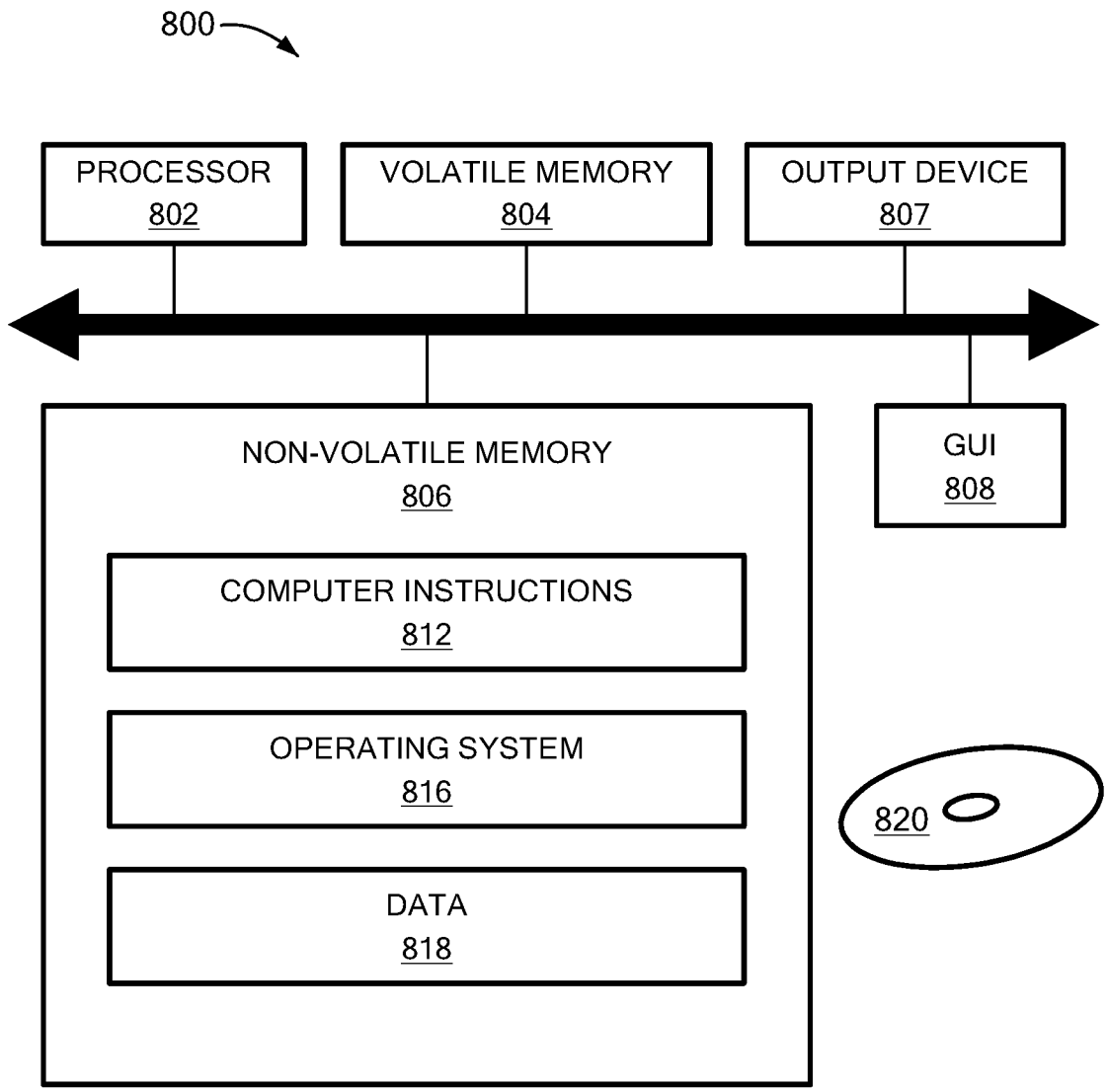
FIG. 8 is a schematic diagram of an example computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A magnetic field sensor, comprising:
a first array of magnetic field sensing elements;
a second array of magnetic field sensing elements, wherein the first array of magnetic field sensing elements is spaced a first distance from the second array of magnetic field sensing elements, wherein the first and second arrays of magnetic field sensing elements each have at least first and second axes of sensitivity, wherein the first axis of sensitivity is orthogonal to the second axis of sensitivity;
a turns counter to count a number of times a magnetic pole pair of a moving target passes the magnetic field sensing elements with a selected pole pair resolution; and
a module to determine absolute angular position of the target from differential signals from the first and second arrays of magnetic field sensing elements and the turns counter,
wherein the first distance is configured to match a pitch of the poles of the target.

2. The sensor according to claim 1, wherein the turns counter provides quarter pole pair resolution.

3. The sensor according to claim 2, wherein the turns counter is configured to increment for a north pole boundary, a middle of the north pole, a boundary between the north pole and a south pole, and a middle of the south pole.

4. The sensor according to claim 1, wherein the first and second arrays of magnetic field sensing elements have a third axis of sensitivity that is orthogonal to the first and second axes of sensitivity, wherein the first, second, and third axes of sensitivity comprises respective x, y, and z axes.

5. The sensor according to claim 4, wherein the sensor is configured to selected two of the first, second, and third axes of sensitivity.

6. The sensor according to claim 1, wherein the sensor is configured to sense rotation of the target, wherein the target comprises a shaft.

7. The sensor according to claim 1, wherein the magnetic field sensing elements comprise Hall elements.

8. The sensor according to claim 1, further including a CORDIC module to determine the angular position.

9. The sensor according to claim 1, wherein the target comprises a ring magnet.

10. The sensor according to claim 1, wherein the first and second arrays of magnetic field sensing elements each have a third axis of sensitivity that is orthogonal to the first and second axes of sensitivity.

11. The sensor according to claim 10, wherein the two of the first, second, and third axes of sensitivity can be used to determine the angular position.

12. The sensor according to claim 1, wherein the sensor is configured to clockwise or counterclockwise rotation of the target.

13. The sensor according to claim 1, wherein the differential signals from the first and second arrays of magnetic field sensing elements comprise a sine signal and a cosine signal.

14. A method, comprising:
employing first and second arrays of magnetic field sensing elements in a sensor, wherein the first array of magnetic field sensing elements is spaced a first distance from the second array of magnetic field sensing elements, wherein the first and second arrays of magnetic field sensing elements each have at least first and second axes of sensitivity, wherein the first axis of sensitivity is orthogonal to the second axis of sensitivity;
counting, using a turns counter, a number of times a magnetic pole pair of a moving target passes the magnetic field sensing elements with a selected pole pair resolution; and
determining absolute angular position of the target from differential signals from the first and second arrays of magnetic field sensing elements and the turns counter, wherein the first distance is configured to match a pitch of the poles of the target.

15. The method according to claim 14, wherein the turns counter provides quarter pole pair resolution.

16. The method according to claim 15, wherein the turns counter is configured to increment for a north pole boundary, a middle of the north pole, a boundary between the north pole and a south pole, and a middle of the south pole.

17. The method according to claim 14, wherein the first and second arrays of magnetic field sensing elements have a third axis of sensitivity that is orthogonal to the first and second axes of sensitivity, wherein the first, second, and third axes of sensitivity comprises respective x, y, and z axes.

18. The method according to claim 17, wherein the sensor is configured to selected two of the first, second, and third axes of sensitivity.

19. The method according to claim 17, wherein the sensor is configured to sense rotation of the target, wherein the target comprises a shaft.

20. The method according to claim 14, wherein the magnetic field sensing elements comprise Hall elements.

21. The method according to claim 14, further including a CORDIC module to determine the angular position.

22. The method according to claim 14, wherein the target comprises a ring magnet.

23. The method according to claim 14, wherein the first and second arrays of magnetic field sensing elements each have a third axis of sensitivity that is orthogonal to the first and second axes of sensitivity.

24. The method according to claim 23, wherein the two of the first, second, and third axes of sensitivity can be used to determine the angular position.

25. The method according to claim 14, wherein the sensor is configured to clockwise or counterclockwise rotation of the target.

26. The method according to claim 14, wherein the differential signals from the first and second arrays of magnetic field sensing elements comprise a sine signal and a cosine signal.

* * * * *